(12) United States Patent
Blumrich et al.

(10) Patent No.: US 7,444,385 B2
(45) Date of Patent: Oct. 28, 2008

(54) GLOBAL INTERRUPT AND BARRIER NETWORKS

(75) Inventors: Matthias A. Blumrich, Ridgefield, CT (US); Dong Chen, Croton-On-Hudson, NY (US); Paul W. Coteus, Yorktown Heights, NY (US); Alan G. Gara, Mount Kisco, NY (US); Mark E Giampapa, Irvington, NY (US); Philip Heidelberger, Cortlandt Manor, NY (US); Gerard V. Kopcsay, Yorktown Heights, NY (US); Burkhard D. Steinmacher-Burow, Mount Kisco, NY (US); Todd E. Takken, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 1031 days.

(21) Appl. No.: 10/468,997

(22) PCT Filed: Feb. 25, 2002

(86) PCT No.: PCT/US02/05567

§ 371 (c)(1),
(2), (4) Date: Aug. 22, 2003

(87) PCT Pub. No.: WO02/069095

PCT Pub. Date: Sep. 6, 2002

(65) Prior Publication Data

US 2004/0068599 A1    Apr. 8, 2004

Related U.S. Application Data

(60) Provisional application No. 60/271,124, filed on Feb. 24, 2001.

(51) Int. Cl.
*G06F 15/16* (2006.01)

(52) U.S. Cl. .................. 709/217; 709/224; 710/260

(58) Field of Classification Search .............. 709/217, 709/224; 710/260
See application file for complete search history.

(56) References Cited

U.S. PATENT DOCUMENTS 5,365,228 A * 11/1994 Childs et al. ............... 340/2.21

(Continued)

FOREIGN PATENT DOCUMENTS

JP    01-241662    9/1989

(Continued)

*Primary Examiner*—Saleh Najjar
*Assistant Examiner*—Thuong (Tina) T Nguyen
(74) *Attorney, Agent, or Firm*—Scully, Scott, Murphy & Presser, P.C.; Daniel P. Morris, Esq.

(57) ABSTRACT

A system and method for generating global asynchronous signals in a computing structure. Particularly, a global interrupt and barrier network is implemented that implements logic for generating global interrupt and barrier signals for controlling global asynchronous operations performed by processing elements at selected processing nodes of a computing structure in accordance with a processing algorithm; and includes the physical interconnecting of the processing nodes for communicating the global interrupt and barrier signals to the elements via low-latency paths. The global asynchronous signals respectively initiate interrupt and barrier operations at the processing nodes at times selected for optimizing performance of the processing algorithms. In one embodiment, the global interrupt and barrier network is implemented in a scalable, massively parallel supercomputing device structure comprising a plurality of processing nodes interconnected by multiple independent networks, with each node including one or more processing elements for performing computation or communication activity as required when performing parallel algorithm operations. One multiple independent network includes a global tree network for enabling high-speed global tree communications among global tree network nodes or sub-trees thereof. The global interrupt and barrier network may operate in parallel with the global tree network for providing global asynchronous sideband signals.

7 Claims, 3 Drawing Sheets

U.S. PATENT DOCUMENTS

| | | | |
|---|---|---|---|
| 5,434,995 A | | 7/1995 | Oberlin et al. |
| 5,570,364 A | * | 10/1996 | Bar-David ................ 370/407 |
| 5,721,921 A | * | 2/1998 | Kessler et al. ............. 718/102 |
| 6,615,383 B1 | * | 9/2003 | Talluri et al. .............. 714/749 |

FOREIGN PATENT DOCUMENTS

| | | |
|---|---|---|
| JP | 06-243113 | 9/1994 |
| JP | 2763886 | 6/1998 |
| WO | WO 88/01771 | 3/1988 |

* cited by examiner

GLOBAL INTERRUPT AND BARRIER NETWORKS

CROSS-REFERENCE TO RELATED APPLICATION

The present invention claims the benefit of commonly-owned, co-pending U.S. Provisional Patent Application Ser. No. 60/271,124 filed Feb. 24, 2001 entitled MASSIVELY PARALLEL SUPERCOMPUTER, the whole contents and disclosure of which is expressly incorporated by reference herein as if fully set forth herein. This patent application is additionally related to the following commonly-owned, co-pending United States Patent Applications filed on even date herewith, the entire contents and disclosure of each of which is expressly incorporated by reference herein as if fully set forth herein. U.S. patent application Ser. No. 10/468,99, for "Class Networking Routing"; U.S. patent application Ser. No. 10/469,000, for "A Global Tree Network for Computing Structures"; U.S. patent application Ser. No. 10/468,997, for 'Global Interrupt and Barrier Networks"; U.S. patent application Ser. No. 10/469,001, for 'Optimized Scalable Network Switch"; U.S. patent application Ser. No. 10/468991, for "Arithmetic Functions in Torus and Tree Networks'; U.S. patent application Ser. No. 10/469,992, for 'Data Capture Technique for High Speed Signaling"; U.S. patent application Ser. No. 10/468,995, for 'Managing Coherence Via Put/Get Windows'; U.S. patent application Ser. No. 11/617,276, for "Low Latency Memory Access And Synchronization"; U.S. patent application Ser. No. 10/468,990, for 'Twin-Tailed Fail-Over for Fileservers Maintaining Full Performance in the Presence of Failure"; U.S. patent application Ser. No. 10/469,996, for "Fault Isolation Through No-Overhead Link Level Checksums'; U.S. patent application Ser. No. 10/469,003, for "Ethernet Addressing Via Physical Location for Massively Parallel Systems"; U.S. patent application Ser. No. 10/469,002, for "Fault Tolerance in a Supercomputer Through Dynamic Repartitioning"; U.S. patent application Ser. No. 10/258,515, for "Checkpointing Filesystem"; U.S. patent application Ser. No. 10/468,998, for "Efficient Implementation of Multidimensional Fast Fourier Transform on a Distributed-Memory Parallel Multi-Node Computer"; U.S. patent application Ser. No. 10/468,993, for "A Novel Massively Parallel Supercomputer"; and U.S. patent application Ser. No. 10/437,766, for "Smart Fan Modules and System".

This invention was made with Government support under subcontract number B517552 under prime contract number W-7405-ENG-48 awarded by the Department of Energy. The Government has certain fights in this invention.

BACKGROUND OF THE INVENTION

1. Field of the Invention

This invention relates generally to the field of distributed-memory message-passing parallel computer design and system software, and more particularly, to a method and apparatus for supporting global interrupts and global barrier operations for multiple interconnected processing nodes of computer structures.

2. Discussion of the Prior Art

In the supercomputing arts, massively parallel computing structures interconnecting large numbers of processing nodes are generally architected as very regular structures, such as grids, lattices or toruses.

One particular problem commonly faced on such massively parallel systems is the efficient computation of a collective arithmetic or logical operation involving many nodes.

While the three-dimensional torus interconnect structure 10 shown in FIG. 1 which comprises a simple 3-dimensional nearest neighbor interconnect which is "wrapped" at the edges works well for most types of inter-processor communication, it does not perform as well for collective operations such as reductions, where a single result is computed from operands provided by each of the compute nodes 12.

It would thus be highly desirable to provide an ultra-scale supercomputing architecture that comprises a unique interconnection of processing nodes optimized for efficiently and reliably performing many classes of operations including those requiring global arithmetic operations, distribute data, synchronize, and share limited resources.

Moreover, on large parallel machines, it is useful to implement some kind of global notifications to signal a certain state to each node participating in a calculation. For example, if some error happens on a node, it would signal a global interrupt so that all other nodes know about it and the whole machine can go into an error recovery state. It is further useful to implement a global barrier to prevent operations in participating nodes until a certain status level for all processing nodes is attained.

It would thus be further desirable to provide a global interrupt and barrier network to have very low latency so that a whole computing structure of interconnected processing elements may return to synchronous operations quickly. The normal messaging passing of high-speed networks such as an interconnected torus are simply not fully suited for this purpose because of longer latency.

SUMMARY OF THE INVENTION

It is an object of the present invention to provide a low-latency, global barrier and interrupt network in a computing structure comprising an interconnection of individual processors so that they can efficiently and reliably perform global arithmetic operations such as global reductions.

It is another object of the present invention to provide a low-latency, global barrier and interrupt network for issuing global interrupt and barrier signals that may efficiently control operations performed at individual processing nodes of a computing structure.

It is further object of the present invention to provide a low-latency, global barrier and interrupt network for issuing global interrupt and barrier signals asynchronously for controlling operations performed at individual processing nodes of a computing structure.

It is yet a further object of the present invention to provide a low-latency, global barrier and interrupt network for issuing global interrupt and barrier signals synchronously for controlling operations performed at individual processing nodes of a computing structure.

It is still another object of the present invention to incorporate a low-latency, global barrier and interrupt network for providing global interrupt and barrier functionality in a scalable, massively parallel supercomputer device, the scalable, massively parallel supercomputing device including a plurality of processing nodes interconnected by an independent network, wherein each node includes one or more processing elements for performing computation or communication activity as required when performing parallel algorithm operations .

It is a further object of the present invention to provide a low-latency, global barrier and interrupt network for providing synchronous or asynchronous global interrupt and barrier functionality that operates in parallel with a physical network arranged as a tree interconnect of processing nodes that perform reliable and efficient global reduction and broadcast operations.

In accordance with a preferred embodiment of the invention, there is provided a global interrupt and barrier network comprising a method and means for generating global interrupt and barrier signals for controlling global asynchronous operations performed by processing elements at selected processing nodes of a computing structure in accordance with a processing algorithm; and method and means interconnecting the processing nodes for communicating the global interrupt and barrier signals to the elements via low-latency paths, the signals respectively initiating interrupt and barrier operations at the processing nodes at times selected for optimizing performance of the processing algorithm.

In a further one advantageous embodiment, the global interrupt and barrier network may be used to synchronize a global clock signal over a whole scalable, massively parallel supercomputer device.

Advantageously, the global interrupt and barrier network for generating global interrupt and barrier signals is implemented in a scalable, massively parallel supercomputer device, the scalable, massively parallel supercomputer including a plurality of processing nodes interconnected by multiple independent networks, each node including one or more processing elements for performing computation or communication activity as required when performing parallel algorithm operations and, a global tree network for enabling high-speed global tree communications among selected nodes of the tree network or sub-trees In a further embodiment, the global interrupt and barrier network may be implemented as a side band network along an existing global tree network implemented in a massively parallel, distributed-memory computer for providing low latency global interrupts and barriers, as well as exhibiting the flexibility for partitioning.

Furthermore, when implemented in a scalable, massively parallel supercomputer incorporating a global tree network, the global interrupt and barrier network of the invention for implementing (synchronous or asynchronous) global barrier and interrupt operations, is well-suited for parallel algorithms performed in the field of life sciences.

BRIEF DESCRIPTION OF THE DRAWINGS

Further features, aspects and advantages of the apparatus and methods of the present invention will become better understood with regard to the following description, appended claims, and the accompanying drawings where:

DETAILED DESCRIPTION OF THE PREFERRED EMBODIMENTS

Figure 2:
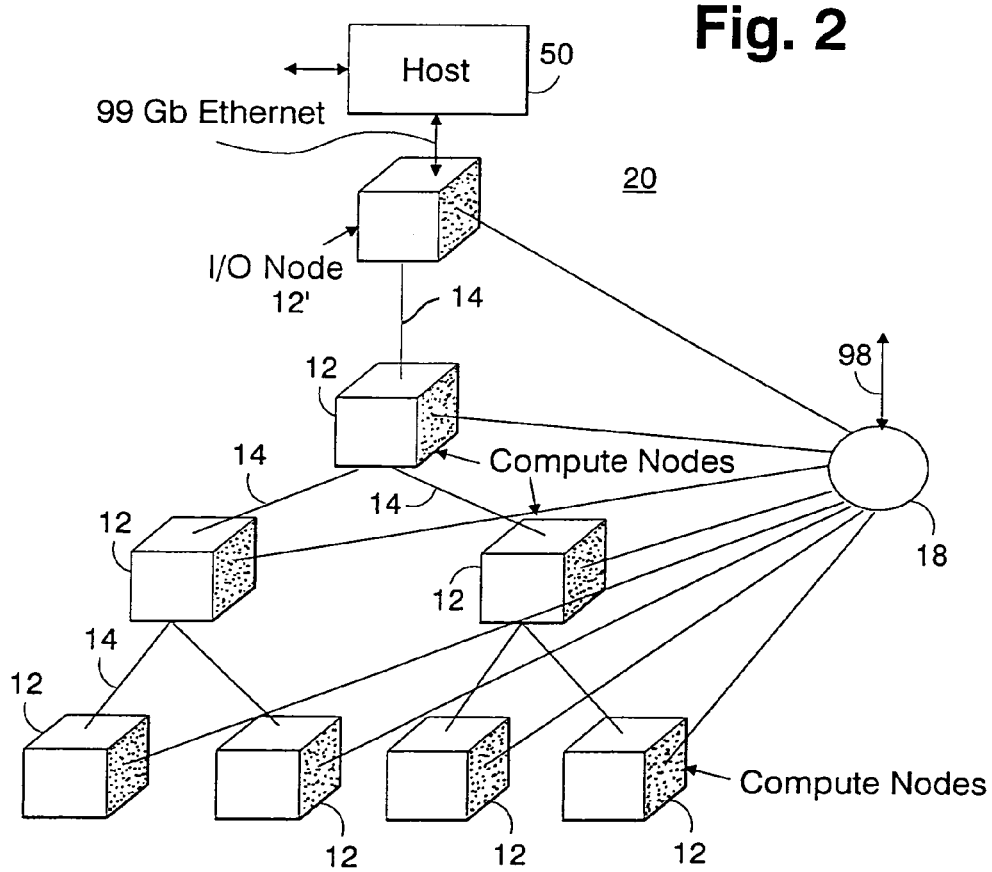
FIG. 2 illustrates a global combining tree network including external network connections according to the invention.
Figure 3:
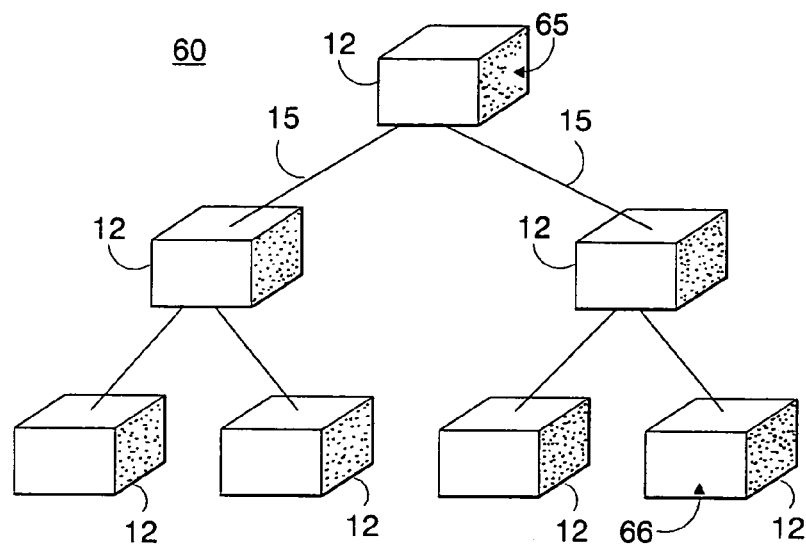
FIG. 3 illustrates the Global Combining Tree and Barrier Network according to the principles of the invention.

According to the invention, as shown in FIG. 3, there is provided for a computing structure such as a Massively Parallel Supercomputer described in herein incorporated commonly-owned, co-pending U.S. patent application Ser. No. 10/468,997 a Global Interrupt and Barrier Network 60 which is a network for communicating global asynchronous or synchronous signals between processing nodes over low-latency communication links 15 interconnecting processing nodes 12 of the structure. In one embodiment, the Global Interrupt and Barrier Network 60 operates in parallel with a Global Combining Tree and message passing network 20, such as shown in FIG. 2, which is a tree configuration comprising links 14 interconnecting the processing nodes 12 for providing asynchronous global operations (e.g., global reductions and notifications) in the massively-parallel supercomputing structure. As shown in FIG. 2, this Global Combining Tree and message passing network 20 further includes association with an input/output node 12' for providing the tree with high-speed access to an external system 50 via a high speed network interfaces 99. All nodes further have direct connectivity to another network interface 98 via a network switch 18.

Figure 1:
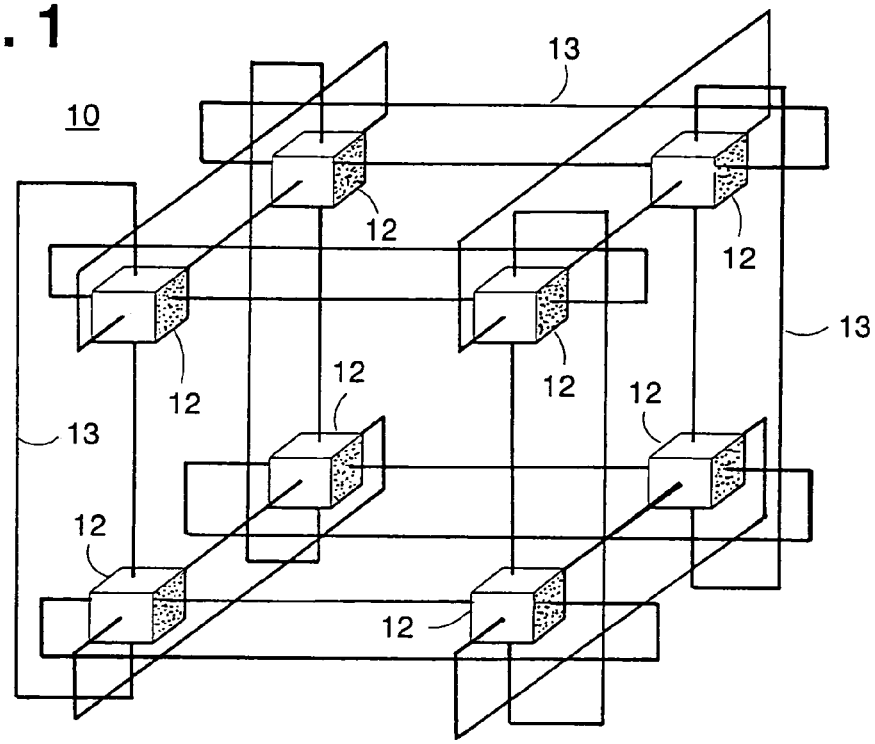
FIG. 1 depicts a small portion 10 of a massively-parallel supercomputing machine which is organized as a three-dimensional torus.

Herein incorporated, commonly-owned, co-pending U.S. patent application Ser. No. 10/468,997 describes such a novel Massively Parallel Supercomputer architecture which is in the form of a three-dimensional torus designed to deliver processing power on the order of teraOPS (trillion floating-point operations per second) for a wide range of applications. The Massively Parallel Supercomputer architecture, in the exemplary embodiment described, comprises 64 k processing nodes organized as a 64×32×32 torus with each compute node 12 connected to six (6) neighboring processing nodes 12 as shown in FIG. 1. This architecture can be leveraged to hundreds of teraOPS for applications that require significantly more computation than communication or which require only nearest neighbor communications.

In a preferred embodiment, as described in greater detail in incorporated commonly-owned, co-pending U.S. patent application Ser. No. 10/468,997, each node is based on a system-on-a-chip process, i.e., all functions of a computer node are integrated into a single ASIC, resulting in dramatic size and power reduction for the node. This supercomputer architecture is further leveraged to increase node density thereby decreasing the overall cost/performance for the machine. Each node preferably incorporates many such functions into the computer ASIC including, but not limited to: a PowerPC 440 embedded processing core, a Floating Point core, embedded DRAM, integrated external DDR memory controller, message processor, Ethernet adapter, as well as network routers. In one embodiment, the same compute ASIC node may function as an I/O node which is associated with a subset of the compute nodes, e.g. 64 nodes, for handling fileserver communication and I/O operations.

As mentioned, the interconnect network connecting the torus compute nodes works well for most types of inter-processor communication but not for collective operations such as reductions, where a single result is computed from operands provided by each of the compute nodes. Thus, in the novel Massively Parallel Supercomputer architecture described in herein incorporated commonly-owned, co-pending U.S. patent application Ser. No. 10/468,997, and further in herein incorporated, commonly-owned, co-pending U.S. patent application Ser. No. 10/469,000 an additional global tree network 20 including routers for physical interconnecting the process nodes 12 along links 14 according to a tree structure as is shown in FIG. 2. The global combining tree network 20 is well suited for moving data as well as computing collective reduction operations and additionally provides broadcast, synchronous barrier, and receiver filtering capability.

As described in Ser. No. 10/468,997 both the torus and the synchronous global tree networks of the massively-parallel supercomputing machine can be partitioned into different logical partitions without re-cabling. Each logical partition is electronically isolated. When implementing the global asynchronous signals of the invention, it is very desirable that they also be partitioned. Thus, in the preferred embodiment, the global asynchronous signals follow the same path as the synchronous global tree (FIGS. 2, 3) and function like side band signals to automatically gain the re-partitioning benefit.

The functionality of the global interrupt and barrier network 60 (FIG. 3) is closely related to the functionality of a global combining tree network 20 and may function as a "sideband" network in parallel therewith. For example the global "or" function is an interrupt, and a global "and" is an "all wait". These functions are utilized in the global interrupt and barrier network 60 by generating and communicating global asynchronous signals comprising: (1) signals that each node in a logical partition (e.g., sub-tree network) can set and detect; (2) hardware logic functions that perform a global AND or OR of all the input signals; and (3) a global network to collect and distribute the results to each node. Several different signals may co-exist in a large system and the idea may be implemented in many ways. These will now be described for use in the massively-parallel, distributed-memory computer as described in herein-incorporated, commonly-owned, co-pending U.S. patent application Ser. No. 10/468,997.

Referring back to FIG. 3, each root node 65 of the global interrupt and barrier network 60 is connected along the route of the Global Combining Tree to a predetermined number of compute nodes 12 of the computing structure and operates in conjunction therewith for initiating global asynchronous operations in the computing structure, e.g., the massively-parallel supercomputer, as needed for a particular parallel algorithm. Preferably, this binary-like combining tree and barrier and interrupt networks may extend over the entire supercomputer machine, allowing data to be sent from any node 12 to all others (broadcast), or a subset of nodes 12, with low latency. It is understood that other tree embodiments, e.g., tertiary-tree, quaternary, etc. may be implemented with the trade-off for lower latency being more interconnects. Message passing is supported on the global combining tree 20, and controlled by either of the processors within each ASIC, allowing intensive operations like all-to-all communication to proceed independent of the compute nodes. Every branch of this tree has a preferred target bandwidth of 1.4 GB/s, or 2 bytes per processor cycle, in both the transmit and receive directions.

The hardware functionality built into the tree 20 is integer addition, maximum, bitwise logical AND, bitwise logical OR, bitwise logical XOR and broadcast. The functions are implemented in the lowest latency manner possible.

Figure 4:
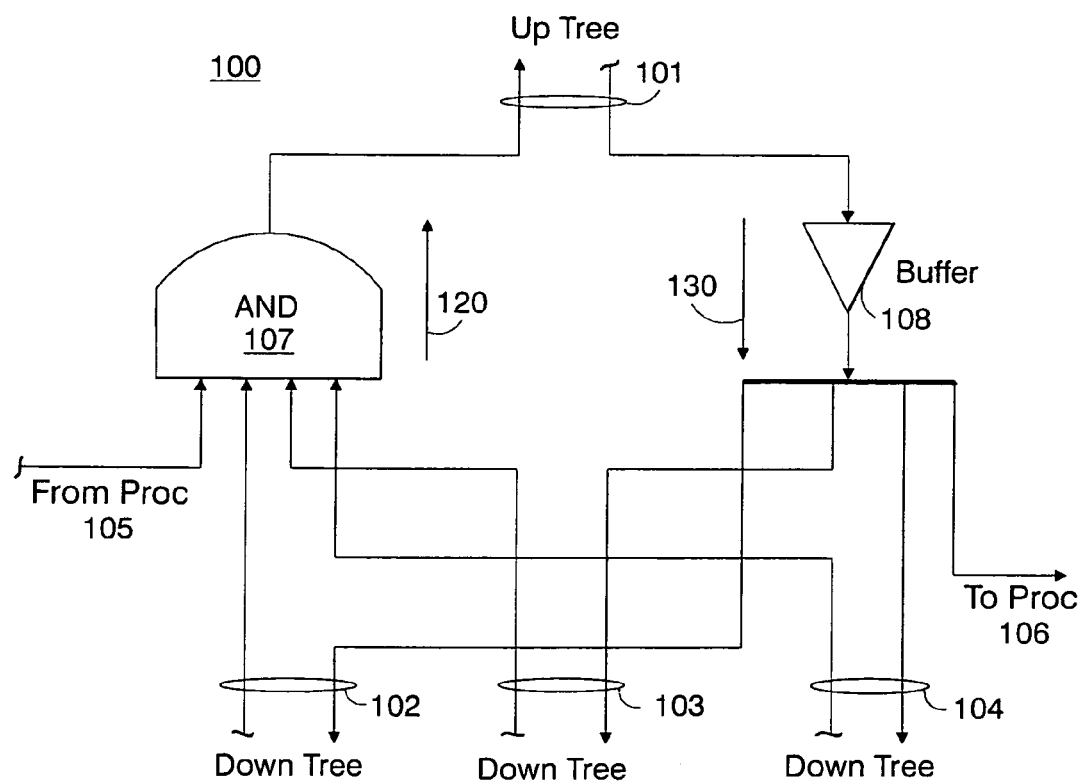
FIG. 4 is a schematic diagram of the asynchronous logic 100 implemented in each ASIC node for the global sideband network associated with tree network of FIG. 2.

A simple yet efficient implementation is to incorporate all the global synchronous and asynchronous functions into a compute node's ASIC, therefore eliminating separate hardware chips and associated packaging for these global asynchronous logic functions. FIG. 4 depicts the logic utilized for asynchronous global signal generation that is implemented in the global interrupt and barrier network of the present invention.

Particularly, in view of FIG. 4, the global interrupt and barrier network 60 when implemented as a sideband network to the global combining tree network of FIG. 2, comprises a network of interconnected router devices, one per node. Each router device includes a number of ports that can either be connected to another router, or disabled when not connected. Details regarding operation of the router may be found in herein incorporated, commonly-owned, co-pending U.S. patent application Ser. No. 10/469,000. For purposes of discussion, however, as shown in FIG. 4, the router has four ports 101-104 providing datapaths, that permit a 3-tree to be constructed. Only one of the four ports, e.g., port 101 is designated as a connection to a parent node, and up to three of the remaining ports can be connected to child nodes. A leaf node at the bottom of the tree will have only the one port connected to its parent node enabled, while the root of the tree will have no parent enabled, but at least one child enabled.

FIG. 4 is a schematic diagram of the asynchronous logic 100 implemented in a router device included in each ASIC node 12 for global signal tree and barrier network of FIG. 3. In the global signal asynchronous network, for each side band signal, there are four (4) logical bi-directional ports, one up tree port (FIG. 3, 101) and three (3) down tree ports (FIG. 4, 102, 103 and 104). These four logical bi-directional ports are mapped onto four physical bi-directional ports. With software configuration, any one of the physical ports may be mapped as the up tree logical port. This allows flexibility in the layout of the board where a number of these nodes are put together. In addition to the up tree and down tree ports, there is an additional input signal 105 generated from an ASIC processor core at every node, and a result signal 106 for input to the processor's interrupt unit. On the up tree path 120, all inputs from down tree ports 102, 103, 104 plus the input 105 from the central processor (CPU) are input to a logic gate 107 before it is sent out on the uptree path. This logic gate 107 will perform a logic AND function when implemented to perform a global barrier operation (inputs transit from logic '0'→'1'), or, may be implemented as an OR function network when implemented to perform a global interrupt operation (inputs transit from logic '1'→'0'). On the down tree path 130, the input signal from up tree is buffered by buffer device 108 and then broadcast to all down tree ports 102, 103 and 104 and the processor. At the very top of the tree, the two signals for the up tree port (FIG. 4, 101) are simply connected together through an initial software configuration either in the top node or in a link chip device enabling torus and tree sub-network partitioning as described in herein incorporated, commonly-owned, co-pending U.S. Provisional patent application Ser. No. 10/468,997.

Figure 5:
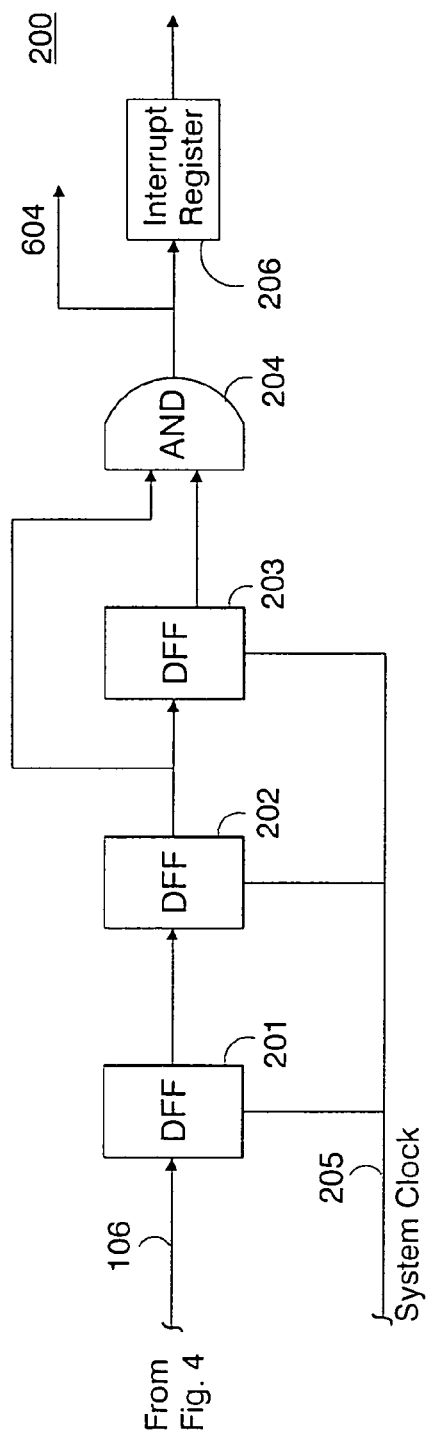
FIG. 5 illustrates the signal detection logic circuit 200 for synchronizing the global signal with the system clock and capturing it; and, FIG. 6 illustrates the logic implemented for an ASIC processor to set a global barrier or a global interrupt, in the global network of FIG. 4.
Figure 6:
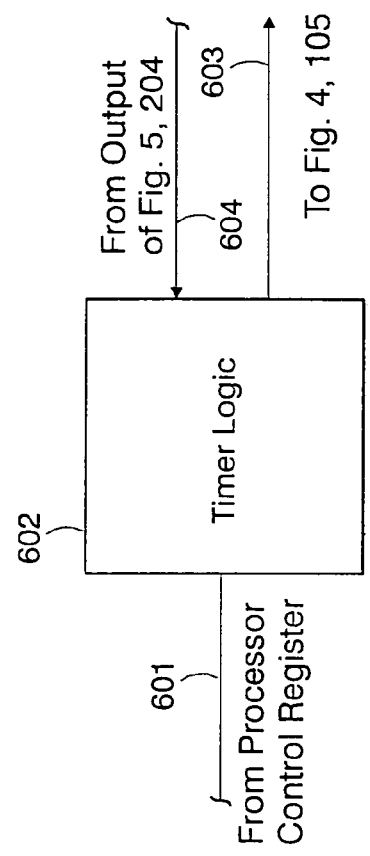

FIG. 6 illustrates the steps implemented for an ASIC processor to set a global barrier in the global network of FIG. 4. As shown in FIG. 6, a signal 601 from a processor control register is input to a timer logic circuit 602 implemented in the ASIC. The signal 601 is initially set to a logic '0'. When the CPU enters the barrier call, it first sets the control register to a logic '1' level, then back to a logic zero '0'. This will generate a '0'→'1'→'0' pulse on line 601. The timer logic circuit 602 preferably includes two programmable hardware timers. When it detects a logic '0'-'1' transition on its input 601, it will set its output signal 603, from level '0' to '1'. It will then wait for signal 604, the output of gate 204 in FIG. 5, to go high signaling the detection of a global barrier. When timer logic 602 detects that signal 604 becomes a level '1', it will start a first timer. After a time period T1 on the first timer, it will initiate a change in output signal 603 to '0', and start the second timer. After a time period T2 on the second timer, the CPU may start another barrier call.

Time T1 is preferably set for a duration necessary to ensure that each node will detect the global interrupt. This is typically only a few system clock cycles. The interrupt register unit that the output of 204 in FIG. 5 is input to has the property of detecting and remembering (until being cleared by the CPU) the transitions from '0' to '1' or from '1' to '0'. Time T2 is preferably slightly longer than the round trip time from the bottom of the tree to the top, then back to the bottom on the asynchronous global network to ensure that every node has exited the previous barrier, so that the next barrier may proceed. Times T1 and T2 do not affect the latency from a barrier being set to it being detected, which is only determined by the network latency.

It is understood that, in connection with the setting of global barriers depicted in FIG. 6, reversing the logic levels '0' and '1' in the above will result in a global OR operation which is suitable for global interrupts except that: (1) signal 106 in FIG. 4, which is directly connected to the input of the flip-flop 201 in the case of global AND, now is inverted and then connects to the input of 201 for the global OR operation through a predetermined software configuration. The end result is that the output 604 of the detection logic in FIG. 5 will always go from '0' to '1' when a global event (barrier or interrupt) has occurred; and, (2) in the case of global OR, the 2 timers described above will automatically start from the time the global interrupt event is detected (604 goes from '0' to '1'), independent of whether the local processor had set the global interrupt or not.

There may be several asynchronous signals implemented on a machine. In the massively-parallel, distributed-memory computer, there is implemented four (4) such signals, each with their own up tree, down tree ports and processor interface. Each signal implemented, are logic level signals and, as discussed above, may function as either a global AND or a global OR. If each processor holds its input 105 high (e.g., a logic 1) at the start of operation, then any one node may be controlled to lower its input when it wants to initiate a global interrupt signal. The final global signal on the top of the tree of FIG. 4 which is broadcast to all nodes will toggle low soon thereafter. This implements a global OR operation, suitable for global interrupts. On the other hand, if each processor 105 holds its signal low (e.g., a logic 0) at the start of operation, then the signal at the top of the upstream path at the root will go high only after all participating nodes raised their corresponding signals. This corresponds to a global AND function, suitable for global barriers. The initial state of a particular asynchronous signal is determined at boot time via a software configuration. In the massively-parallel, distributed-memory computer, out of the four global asynchronous signals, it is intended that two are implemented for global AND operations and two for global OR operations.

It should be noted that there is no theoretical limit for the number of down tree ports even though in an exemplary embodiment of the massively-parallel, distributed-memory computer, the number of down tree ports is three (3). For a given machine size, not all down tree ports on every node are utilized. Every port can be individually disabled via a software mask. The same is true for the processor signals so that a node would not interfere with the global operations if it does not participate in it (such as the processors in I/O nodes, for example).

Because these signals are propagated asynchronously, the total round trip delay from bottom of the tree to the top and then back to the bottom is determined only by the internal gate delay of an ASIC, the cable delay between nodes and the total number of hops for the total round trip. This is very fast because the tree structure reduces the total number of hops and small gate delay within an ASIC (no signal recapturing and re-synchronization involved). It is estimated that this delay is only a few hundred processor cycles on a 64 k node system, for example, which is extremely fast for a machine of such large scale.

Finally, when the asynchronous signal comes back to the processors on a node (FIG. 4, 106), it is required that it synchronize with the system clock. This is performed by feeding the signal through a detection circuit 200 comprising a serial configuration of several D type flip-flops 201-203 clocked by the system clock signal 205, as shown in the signal detection logic circuit depicted in FIG. 5.

Particularly, as shown in FIG. 5, the asynchronous global signal 106 returning to the processor from the asynchronous global tree, is directly connected to the input of a first D-Flip Flop 201 if the side band global signal is configured as a global AND and in inverted form if it is a global OR. Particularly, outputs from different flip-flops 202 and 203 are ANDed together by logic gate 204 before sending the signal to the processor's interrupt register 206. In this manner, only signals that have a pulse width larger than the system clock will be detected. This is to avoid false detection of noise induced glitches in the global asynchronous network logic. The processor's interrupt register will generate a maskable interrupt when its input changes from logic "0" to "1", for example. This logic is duplicated for each of the global asynchronous signals.

Further, the interrupt register 206 will be able to detect and remember (until being cleared) the logic '0' to '1' transition. This edge sensitive interrupt unit 206 is used so that the timer logic 602 in FIG. 6 may de-assert a signal after a timeout period to prepare for the next global barrier or global interrupt call.

For the supercomputing architecture described in herein incorporated commonly-owned, co-pending U.S. Provisional patent application Ser. No. 10/468,997, any packet may be injected into a global tree network with an interrupt request attached. According to the invention, the eventual effect of this is to cause a maskable interrupt at every node that receives the packet or, in the case of reductions, a result computed from the packet. A reduction result will cause interrupts if any of the injected packets contributing to that result requested an interrupt.

A global reduction operation over the global combining network will also imply a global barrier. This is because the network will block until all participating nodes have injected their corresponding operands. Therefore, software barriers can also be implemented through global reductions on the global combining network, though the latency will be higher than the asynchronous network. Because of much less logic involved in the design, the global asynchronous network of the invention is also generally more reliable.

A global broadcast on the dual functional global combining network may additionally be used to trigger interrupts at every receiving node. This leads to global interrupts implemented over the global combining network.

Even though the global asynchronous network described herein may be implemented as asynchronous side band signals following the global combining tree network (FIG. 2), and asynchronous logics integrated into the ASIC, it should be understood that the asynchronous network-may be implemented using either synchronous or asynchronous logic. The logic may be integrated into an ASIC or be implemented on separate logic chips and, furthermore, does not need to follow the combining network strictly, especially on the system board level. It is, however, generally preferred for the asynchronous network to follow the combining network on higher integration level, like on a crate level, so that the easy partitioning of the combining network can be realized.

For instance, in addition, the global interrupt and barrier network of the invention may be used to synchronize a global clock over the whole parallel machine structure. Every CPU inside a node has an internal timer that generates a local time. The first step to calibrate this local clock is to measure the round trip time from each node setting a global interrupt (global OR) signal to it receiving the same interrupt, after a round trip to the top of the tree. As illustrated in FIG. 3, root node 65 sits at the top of the tree network, whereas node 66 is somewhere in the middle or, as shown in FIG. 3, at the bottom of the tree network. When all other nodes are idle (not inserting a global interrupt), node 66 will set a global interrupt, record the current local time as T1. When the interrupt travels up-tree then down-tree to node 66, it records the time when the global interrupt is received as T2. Then T=T2−T1 is the total round trip time from node 66 to the top of tree. This timing step will be performed one node after another. Once every node is calibrated, the second step is for the top node 65, to set its local time to 0, and to set a global interrupt in the mean time. When node 66 detects the global interrupt, it sets its timer to T/2. Every other node will do the same. Once this step is over, every node within a partition will have synchronized their clock to a global clock with very high accuracy, within a few clock cycles (e.g., 10 cycles) or a few nanoseconds (e.g., 10 nano-seconds) at most.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method for implementing global asynchronous operations in a computing structure comprising a plurality of nodes interconnected by at least one high-speed network, said method comprising:
   a) generating global interrupt and barrier signals for controlling global asynchronous operations performed by processing elements at selected processing nodes of a computing structure executing a parallel application, and,
   b) providing another high-speed network interconnecting said processing nodes to form a tree network comprising low-latency paths between said nodes for communicating said global interrupt and barrier signals to said elements via said low-latency paths, said signals respectively initiating interrupt and barrier operations at said processing nodes at times selected for optimizing performance of said parallel application,
   wherein said global interrupt and barrier signals flow upstream from children to parent nodes of said tree and downstream from parent nodes to child nodes of said tree, and,
   wherein each said node includes an associated routing device for routing signals to other nodes, said router including an upstream port for routing said global asynchronous signals in respective upstream direction toward a parent node of said tree network and down stream ports for broadcasting global asynchronous signals in a respective downstream direction toward child nodes of said tree network, and,
   said method further comprising:
   implementing logic at each node in response to signals received from processing elements included at said node and from other nodes connected therewith for initiating interrupt and barrier operations at parent and child nodes of said node in said tree,
   setting an asynchronous global barrier or interrupt signal in response to a control signal from said processing element, and,
   detecting, by a detecting device at each node, receipt of an asynchronous global signal, and,
   synchronizing said received asynchronous signal with a system clock signal for avoiding false detection of noise in said tree network,
   wherein the global signals are generated and communicated asynchronously,
   receiving signals from one or more connecting nodes, and performing a global logical AND operation upon said signals, said logical AND operation functioning to enable a global barrier operation at said selected nodes, wherein said selected nodes are prevented from processing operations until said global barrier operation has completed.

2. The method as claimed in claim 1, implemented in a scalable, massively-parallel computing structure comprising a plurality of interconnected processing nodes each including said processing element, said nodes being interconnected by an independent toms network.

3. The method as claimed in claim 1, wherein the global signals are communicated synchronously.

4. The method as claimed in claim 1, wherein said generating step further includes the step implemented at each node of:
   receiving signals from one or more connecting nodes, and performing a global logical OR operation upon said signals, said logical OR operation functioning to enable global notification operations at said selected nodes.

5. The method as claimed in claim 4, wherein said computing structure further includes an independent global tree network for enabling high-speed global tree communications among said processing nodes, said interconnecting of said processing nodes forming a tree network operating in parallel with said independent global tree network for initiating said global asynchronous operations in coordination with said processing algorithm.

6. The method as claimed in claim 1, wherein said logic implemented for detecting an asynchronous global signal is an edge sensitive interrupt register.

7. The method as claimed in claim 1, further including the step of utilizing said global interrupt and barrier network for synchronizing a global clock over a whole computer structure.

* * * * *